US012804815B2

(12) United States Patent
Wang et al.

(10) Patent No.: US 12,804,815 B2
(45) Date of Patent: Nov. 17, 2026

(54) POWER MODULE AND POWER DEVICE

(71) Applicant: Delta Electronics, Inc., Taoyuan City (TW)

(72) Inventors: Zhiwei Wang, Shanghai (CN); Quansong Luo, Shanghai (CN); Kaijian Yang, Shanghai (CN); Zhongwang Yang, Shanghai (CN)

(73) Assignee: Delta Electronics, Inc., Taoyuan City (TW)

( * ) Notice: Subject to any disclaimer, the term of this patent is extended or adjusted under 35 U.S.C. 154(b) by 232 days.

(21) Appl. No.: 18/750,025

(22) Filed: Jun. 21, 2024

(65) Prior Publication Data

US 2025/0031307 A1 Jan. 23, 2025

(30) Foreign Application Priority Data

Jul. 21, 2023 (CN) ......................... 202310902099.3

(51) Int. Cl.
*H05K 1/14* (2006.01)

(52) U.S. Cl.
CPC ......... *H05K 1/144* (2013.01); *H05K 2201/08* (2013.01); *H05K 2201/10053* (2013.01); *H05K 2201/10719* (2013.01)

(58) Field of Classification Search
CPC ............... H05K 1/144; H05K 2201/08; H05K 2201/10053; H05K 2201/10719
USPC .......................................................... 361/784
See application file for complete search history.

(56) References Cited

U.S. PATENT DOCUMENTS

| | | | | |
|---|---|---|---|---|
| 7,622,823 B2 | 11/2009 | Morishima et al. | | |
| 2005/0168961 A1* | 8/2005 | Ono | H05K 1/183 | 257/E25.011 |
| 2006/0038549 A1* | 2/2006 | Mehrotra | H02M 7/003 | 323/306 |

FOREIGN PATENT DOCUMENTS

| | | | |
|---|---|---|---|
| CN | 102082547 | B | 4/2013 |
| CN | 103956927 | A | 7/2014 |
| CN | 104065293 | A | 9/2014 |
| CN | 103326606 | B | 8/2015 |
| CN | 103337949 | B | 6/2016 |
| CN | 104518518 | B | 11/2016 |
| CN | 104917406 | B | 5/2017 |
| CN | 207069596 | U | 3/2018 |
| CN | 105610343 | B | 4/2018 |
| CN | 106208782 | B | 7/2018 |
| CN | 207691450 | U | 8/2018 |

(Continued)

*Primary Examiner* — Binh B Tran
(74) *Attorney, Agent, or Firm* — KIRTON McCONKIE; Evan R. Witt

(57) ABSTRACT

A power module is disclosed and includes an upper surface for receiving multiple input signals, a lower surface for outputting multiple output signals, a top layer circuit board, a bottom layer circuit board and a middle layer. The top layer circuit board includes a first surface and a second surface disposed opposite to each other, and multiple electronic devices. The first surface forms the upper surface, and multiple first signal connection parts are disposed on the first surface for receiving the multiple input signals. The bottom layer circuit board includes a third surface and a fourth surface disposed oppositely. The fourth surface forms the lower surface, and multiple second signal connection parts are disposed on the fourth surface for outputting the multiple output signals. The middle layer is disposed between the top layer circuit board and the bottom layer circuit board.

21 Claims, 16 Drawing Sheets

(56) References Cited

FOREIGN PATENT DOCUMENTS

| | | | |
|---|---|---|---|
| CN | 208094260 | U | 11/2018 |
| CN | 106159935 | B | 12/2018 |
| CN | 106159981 | B | 12/2018 |
| CN | 106301051 | B | 3/2019 |
| CN | 106301054 | B | 7/2019 |
| CN | 105871239 | B | 9/2019 |
| CN | 110212562 | A | 9/2019 |
| CN | 109412442 | B | 5/2020 |
| CN | 211507640 | U | 9/2020 |
| CN | 110739875 | B | 11/2020 |
| CN | 110932589 | B | 1/2021 |
| CN | 213782882 | U | 7/2021 |
| CN | 113381496 | A | 9/2021 |
| CN | 113507205 | A | 10/2021 |
| CN | 113992112 | A | 1/2022 |
| CN | 112165269 | B | 3/2022 |
| CN | 114597926 | A | 6/2022 |
| CN | 217007615 | U | 7/2022 |
| CN | 114884169 | A | 8/2022 |
| CN | 114977850 | A | 8/2022 |
| CN | 113114032 | B | 10/2022 |

* cited by examiner

6

5a

POWER MODULE AND POWER DEVICE

CROSS-REFERENCE TO RELATED APPLICATION

This application is based upon and claims priority to Chinese Patent Application No. 202310902099.3, filed on Jul. 21, 2023, the entire contents thereof are incorporated herein by reference.

FIELD OF THE INVENTION

The present disclosure relates to a power module, and more particularly to a power module and a power device capable of increasing the efficiency, increasing the power density, reducing line loss, and facilitating miniaturization and integration.

BACKGROUND OF THE INVENTION

FIG. 1 is a schematic structural diagram illustrating a first type of a conventional electronic device. As shown in FIG. 1, the conventional electronic device adopts a horizontal power supplying structure. The horizontal power supplying structure includes a Central Processing Unit (CPU) 11, a power module 12, a system board 13 and an output capacitor 14. The power module 12 is used for receiving an input voltage, converting the voltage, and providing a power signal to the CPU 11 through a planar trace. The power module 12 and the CPU 11 are both disposed on a first surface of the system board 13.

However, the required current of the CPU 11 becomes larger, and the requirement of the volume of the electronic device is smaller. The CPU 11 and the power module 12 shown in FIG. 1 are disposed on the same side so that the trace for connecting the CPU 11 and the power module 12 become longer and the parasitic resistance on the trace become larger. Consequently, the conduction loss is larger, and the efficiency of providing the power to the CPU 11 by the power module 12 is decreased.

FIG. 2 is a schematic structural diagram illustrating a second type of a conventional electronic device. As shown in FIG. 2, in order to reduce the volume of the electronic device and increase the efficiency of supplying the power to CPU by the power module, the second type of the electronic device is employed by changing the conventional horizontal power supplying structure to a vertical power supplying structure. That is, the power module 12 is disposed on a second surface of the system board 13, and the power module 12 and the CPU 11 are disposed on the opposed surfaces of the system board 13. Accordingly, the volume of the electronic device is effectively reduced so that the trace between the CPU 11 and the power module 12 is shorten, and the parasitic resistance of the trace becomes smaller to decrease the conduction loss and increase the efficiency of the power module.

However, in the conventional vertical power supplying structure, the traces for the input voltage of the power module 12 and the other signal of the module pass through the system board 13, and pass through the contact surface of the system board 13 and the power module 12 to realize an electronic connection with the power module 12. Accordingly, a large amount of the internal space of the system board 13 is occupied to impact the trace layout of CPU, which is the target for supplying power. Accordingly, the conventional vertical power supplying structure cannot effectively increase the efficiency, increase the power density, and reduce the line loss. In addition, since the input voltage passes through the system board 13, the system board 13 is required to provide an additional power layer and a related shielding layer, which is not beneficial for development trend of miniaturization and integration.

Accordingly, it is necessary to develop a power module and a power device to solve the problems encountered by the conventional arts.

SUMMARY OF THE INVENTION

An object of the present disclosure is to provide a power module and a power device in order to address the issues encountered by the conventional power module, which cannot effectively increase the efficiency, increase the power density, and reduce the line loss, and is not beneficial for development trend of miniaturization and integration.

In accordance with an aspect of the present disclosure, a power module is provided. The power module includes an upper surface for receiving multiple input signals; a lower surface for outputting multiple output signals, a top layer circuit board, a bottom layer circuit board and a middle layer. The upper surface and the lower surface are two outer sides of the power module. The top layer circuit board includes a first surface, a second surface and multiple electronic devices. The first surface and the second surface are disposed oppositely, the first surface forms the upper surface, and multiple first signal connection parts are disposed on the first surface for receiving the multiple input signals. The bottom layer circuit board includes a third surface and a fourth surface. The third surface and a fourth surface are disposed oppositely, the fourth surface forms the lower surface, and multiple second signal connection parts are disposed on the fourth surface for outputting the multiple output signals. The middle layer is disposed between the top layer circuit board and the bottom layer circuit board.

In accordance with an aspect of the present disclosure, a power device is provided. The power device includes at least one external connection terminal for providing at least one input signal, a power module and a system board. The power module includes an upper surface and a lower surface for outputting at least one output signal disposed at two outer sides of the power module, a top layer circuit board, a bottom layer circuit board and a middle layer. The top layer circuit board includes a first surface, a second surface and multiple electronic devices. The first surface and the second surface are disposed oppositely, the first surface forms the upper surface, and at least one first signal connection part is disposed on the first surface. The first signal connection part is electrically connected to the external connection terminal for receiving the input signal. The bottom layer circuit board includes a third surface and a fourth surface. The third surface and a fourth surface are disposed oppositely, the fourth surface forms the lower surface, and at least one second signal connection part is disposed on the fourth surface for outputting the output signal. The middle layer is disposed between the top layer circuit board and the bottom layer circuit board. The system board is disposed on the fourth surface for receiving the output signal outputted from the second signal connection part.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to limited the present disclosure.

Figure 1:
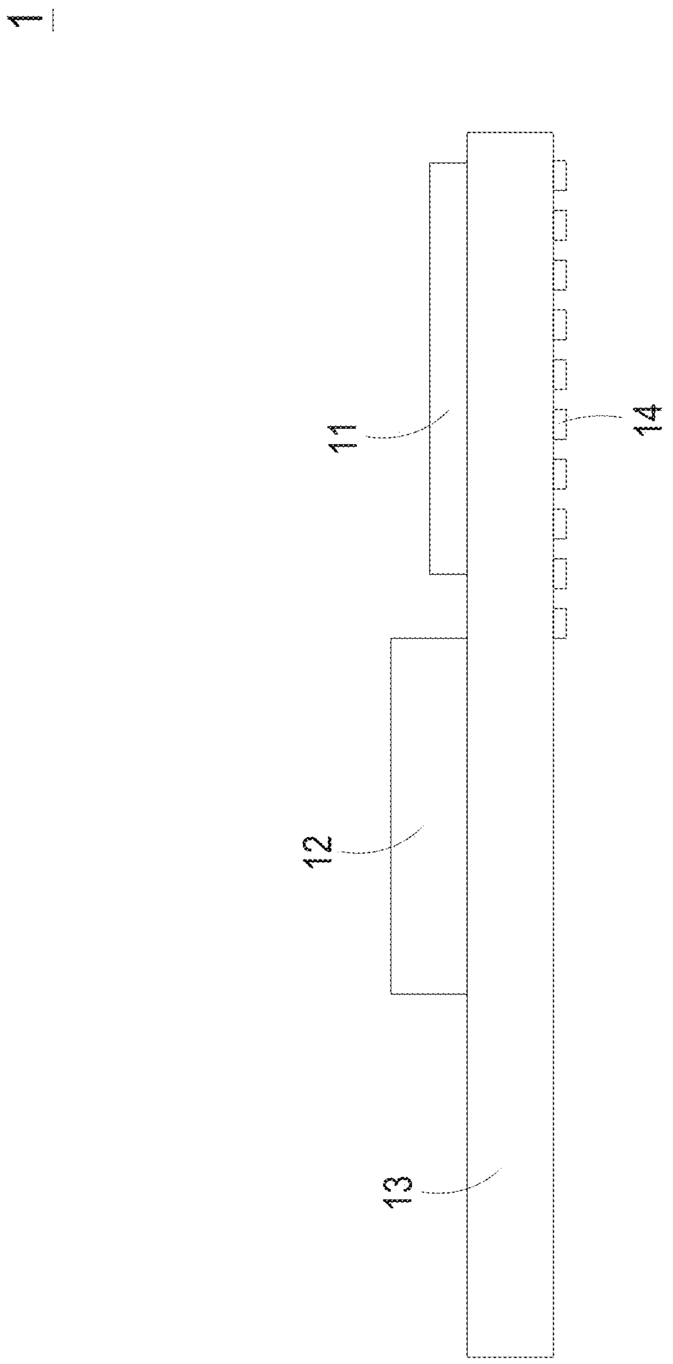
FIG. 1 PRIOR ART
FIG. 1 is a schematic structural diagram illustrating a first type of an electronic device according to the conventional art.
Figure 2:
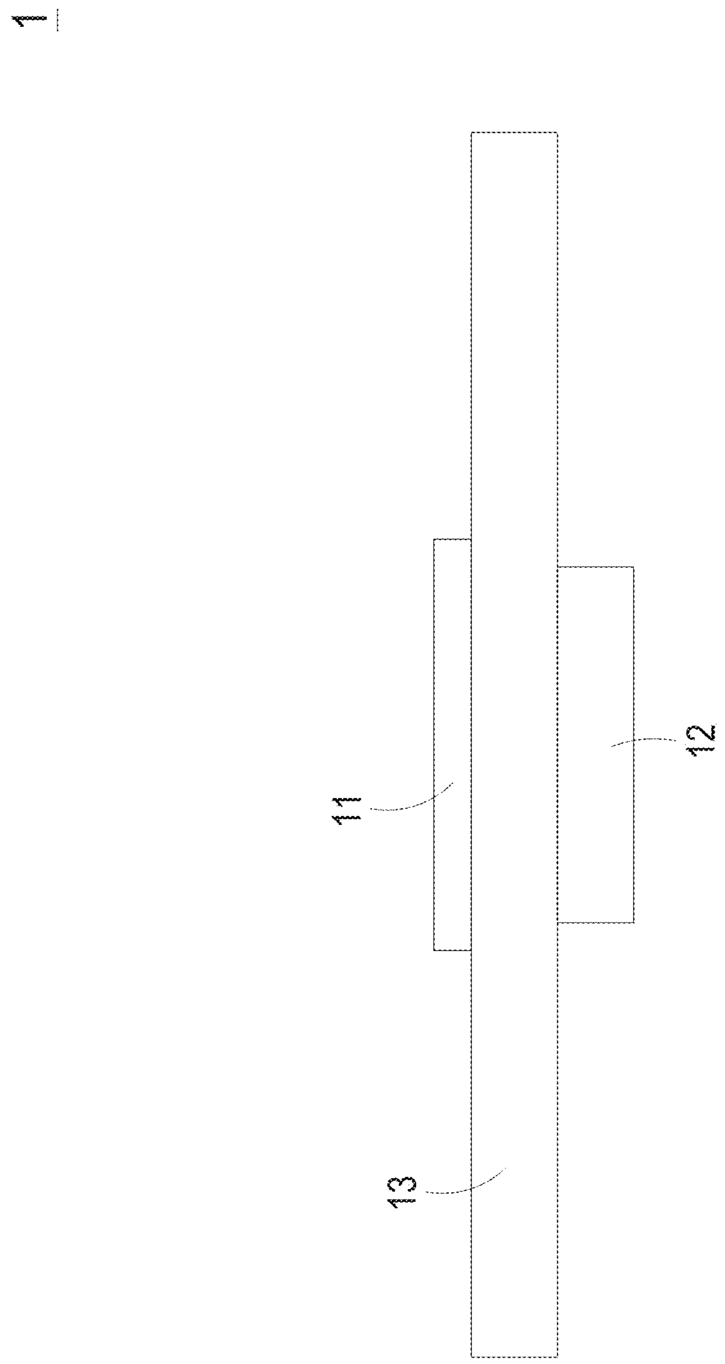
FIG. 2 PRIOR ART
FIG. 2 is a schematic structural diagram of a second type of an electronic device according to the conventional art.
Figure 3A:
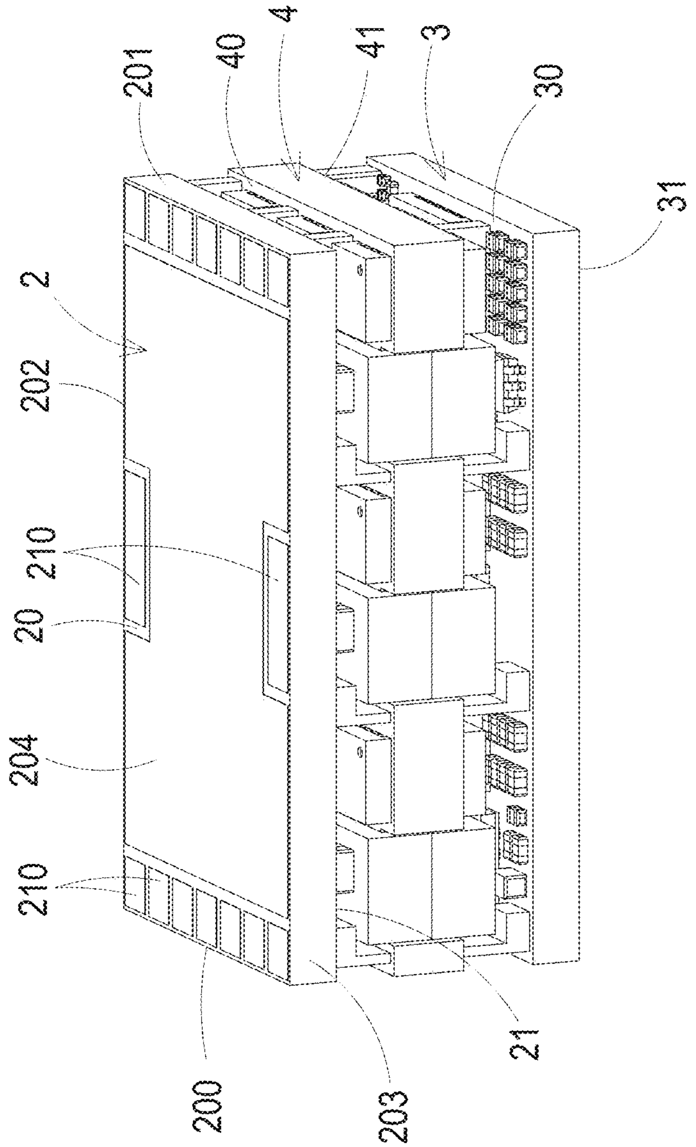
FIG. 3A is a schematic structural diagram illustrating a power module according to a first embodiment of the present disclosure.
Figure 3B:
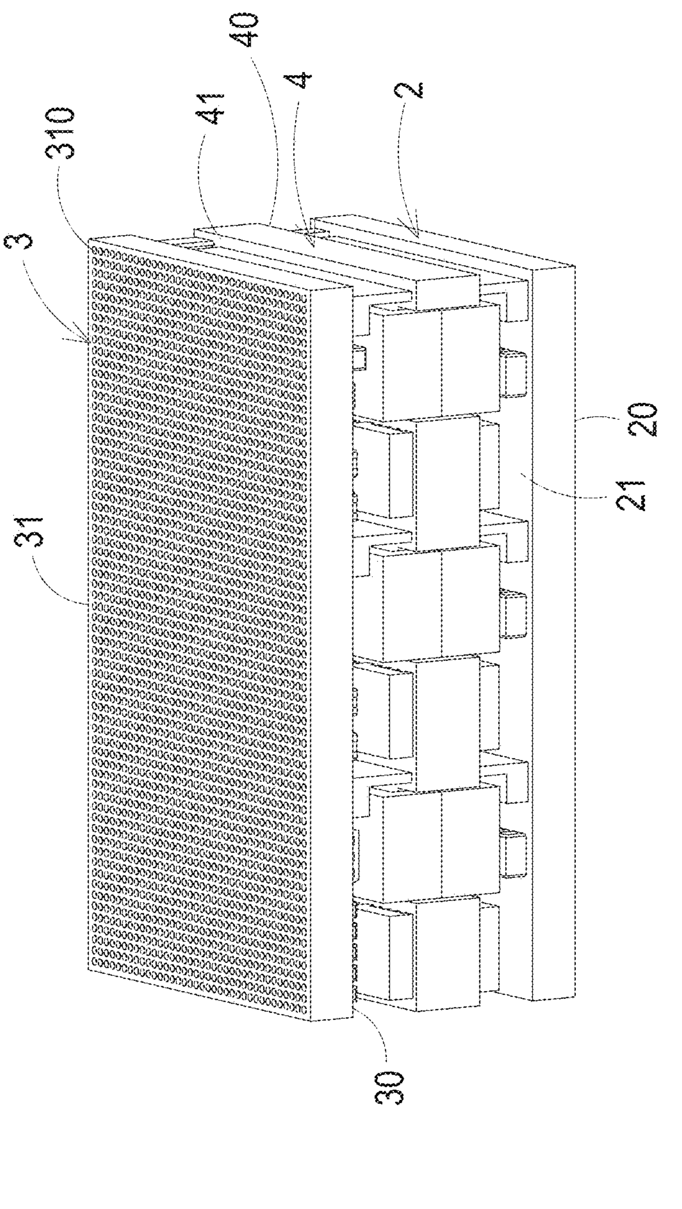
FIG. 3B is a schematic structural diagram illustrating the power module according to the first embodiment of the present disclosure from another perspective.
Figure 3C:
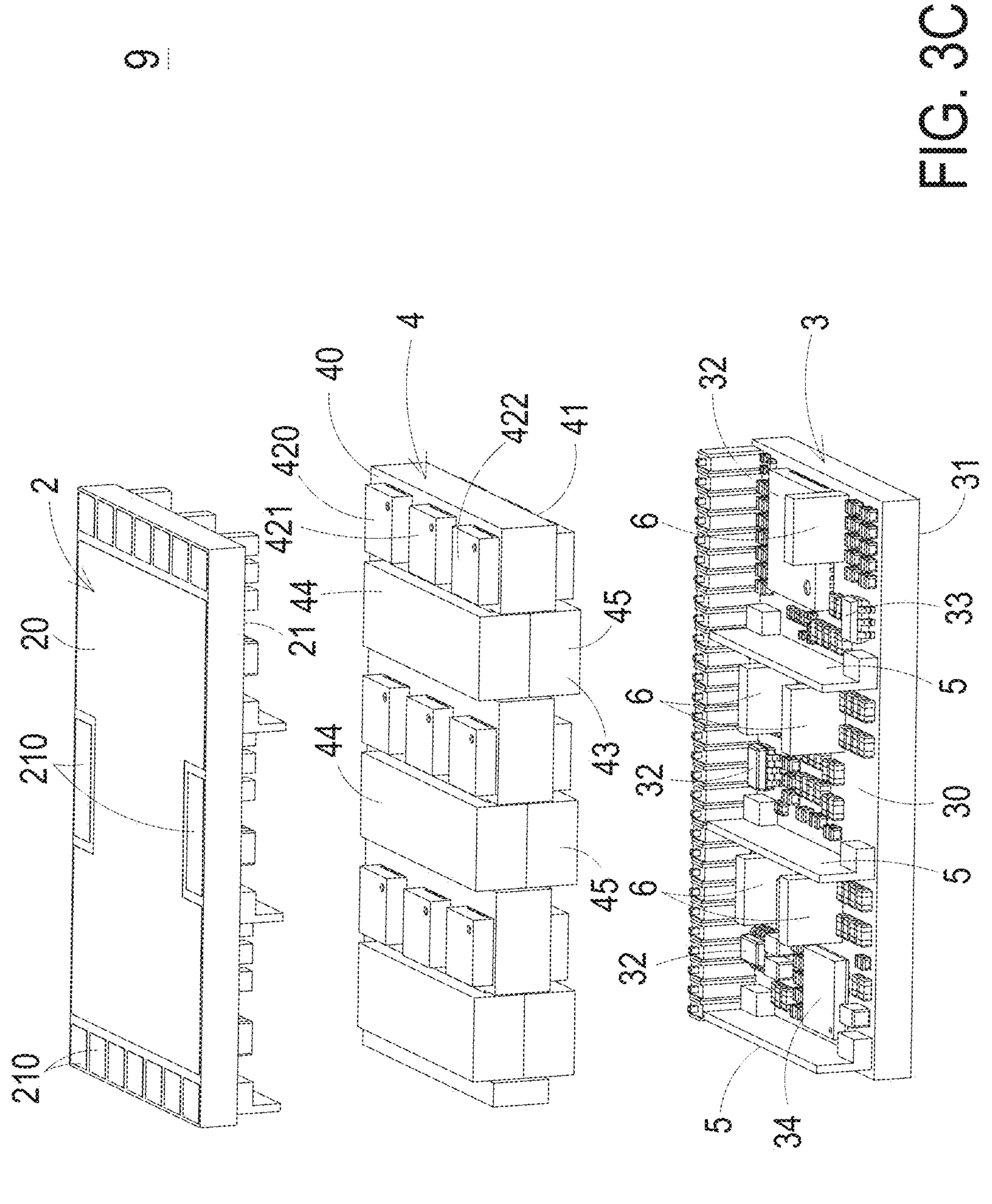
FIG. 3C is an exploded view illustrating the power module according to the first embodiment of the present disclosure.
Figure 3D:
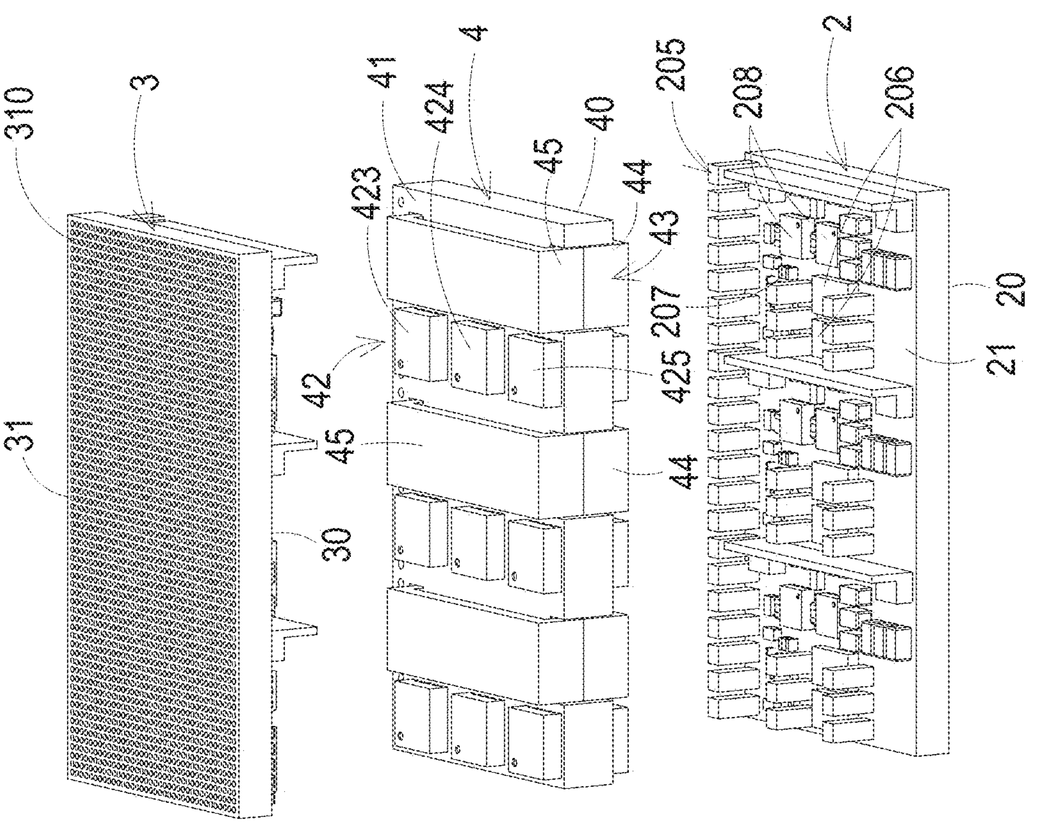
FIG. 3D is an exploded view illustrating the power module according to the first embodiment of the present disclosure from another perspective.
Figure 3E:
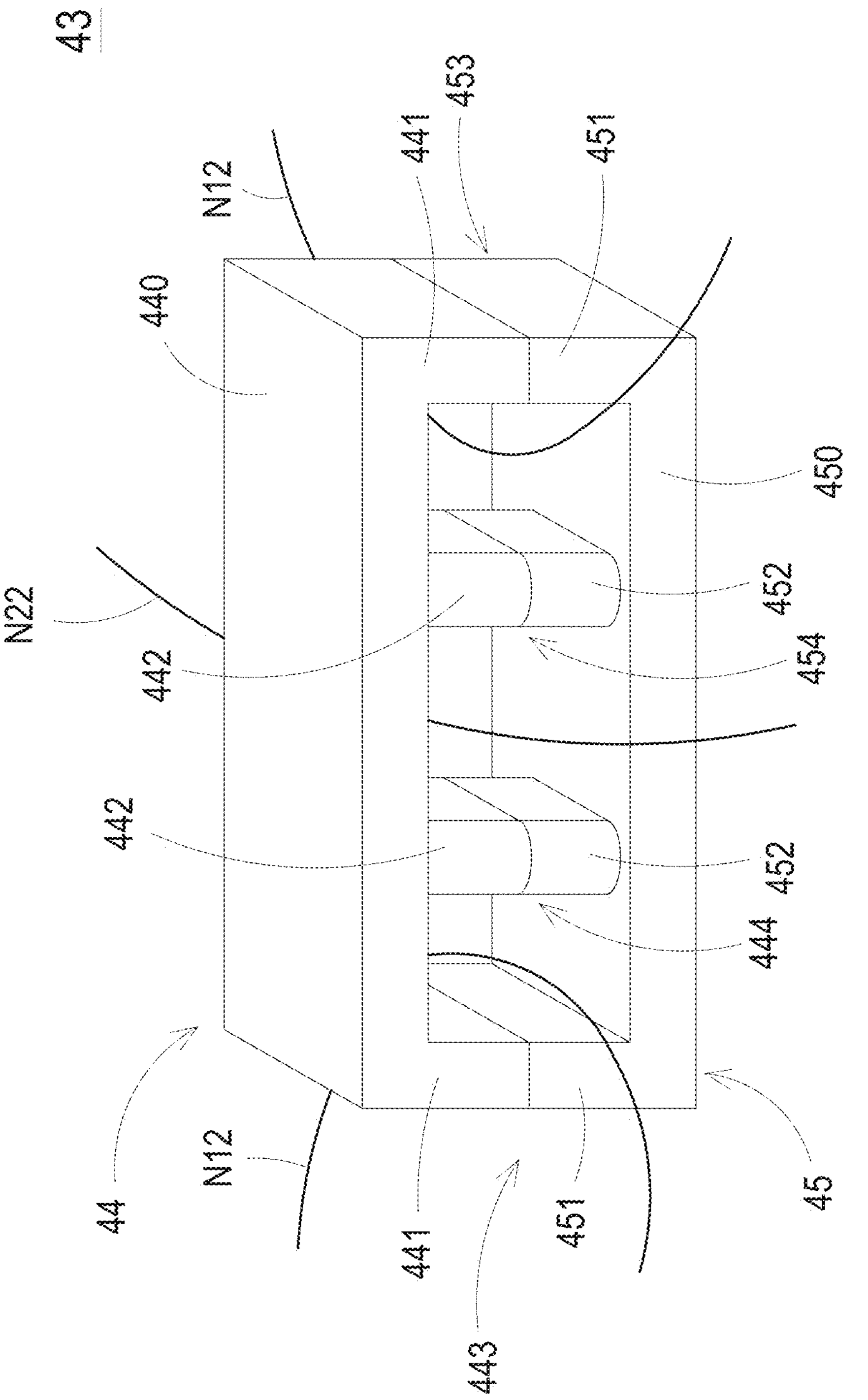
FIG. 3E is a schematic structural diagram illustrating the magnetic component of the power module according to the first embodiment of the present disclosure.
Figure 3F:
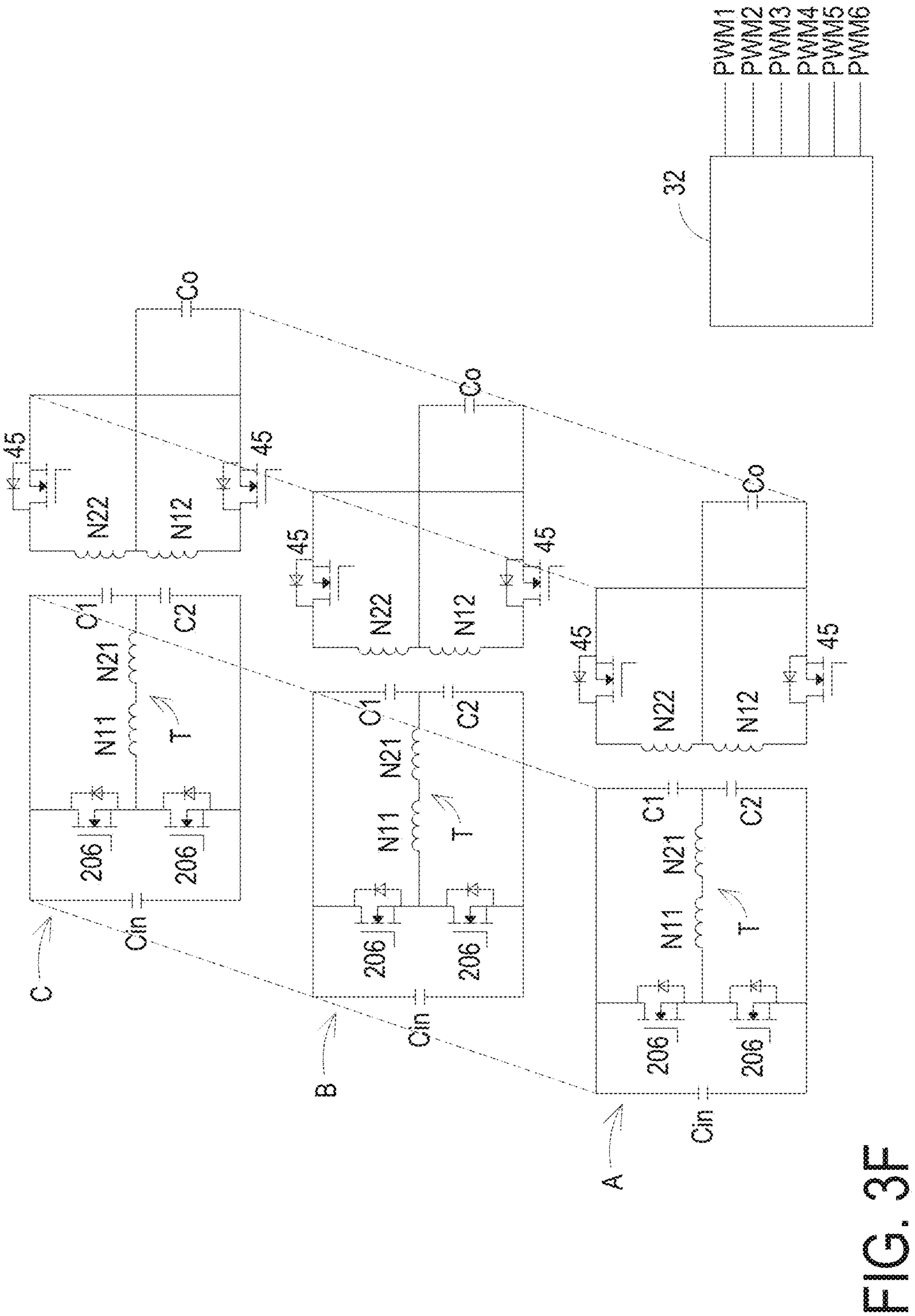
FIG. 3F is a schematic diagram illustrating a circuit of the power module according to the first embodiment of the present disclosure.

The present disclosure is a power module. The power module includes an upper surface, a lower surface, a top layer circuit board, a bottom layer circuit board and a middle layer. The upper surface receives multiple input signals. The lower surface and the upper surface are disposed at two outer sides of the power module, and the lower surface outputs multiple output signals. The top layer circuit board includes a first surface, a second surface and multiple electronic devices. The first surface forms the upper surface, and multiple first signal connection parts are disposed on the first surface for receiving input signals. The bottom layer circuit board includes a third surface and a fourth surface. The third surface and a fourth surface are disposed oppositely. The fourth surface forms the lower surface. Multiple second signal connection parts are disposed on the fourth surface for outputting the output signals. The middle layer is disposed between the top layer circuit board and the bottom layer circuit board FIG. 3A is a schematic structural diagram illustrating a power module according to a first embodiment of the present disclosure. FIG. 3B is a schematic structural diagram illustrating the power module according to the first embodiment of the present disclosure from another perspective. FIG. 3C is an exploded view illustrating the power module according to the first embodiment of the present disclosure. FIG. 3D is an exploded view illustrating the power module according to the first embodiment of the present disclosure from another perspective. FIG. 3E is a schematic structural diagram illustrating the magnetic component of the power module according to the first embodiment of the present disclosure. FIG. 3F is a schematic diagram illustrating a circuit of the power module according to the first embodiment of the present disclosure. Referring to FIG. 3A, FIG. 3B, FIG. 3C, FIG. 3D, FIG. 3E and FIG. 3F, the present disclosure provides a power module 9. Preferably but not exclusively, the power module 9 is applied in an electronic device (not shown), and connected with a system board in the electronic device through a welding method to realize an electronic connection. As shown in FIG. 3A, in the embodiment, the power module 9 includes at least one magnetic integration circuit. Preferably but not exclusively, as shown in FIG. 3F, the power module 9 includes three magnetic integration circuits A, B, C. The input terminals of the three magnetic integration circuits A, B, C are connected in parallel to form a total input terminal of the power module 9 for receiving the power provided by an external power source (not shown). The output terminals of the three magnetic integration circuits A, B, C are connected in parallel to form a total output terminal of the power module 9 for outputting a voltage. Since the circuit structures of the magnetic integration circuits A, B, C are similar, the following content only illustrates the structure of the magnetic integration circuit A. The structures, elements and functions of the magnetic integration circuits B, C are similar to those of the magnetic integration circuit, and are not redundantly marked and described herein.

The magnetic integration circuit A includes an input capacitor Cin, at least one primary side switch 206, two bridge capacitors C1, C2, a transformer T, at least one secondary side switch 45 and an output capacitor Co. Preferably but not exclusively, the at least one primary side switch 206 includes two primary side switches 206. In the embodiment, the two primary side switches 206 are connected in series, and further connected to the input capacitor Cin in parallel. The two bridge capacitors C1, C2 are connected in series, and are connected in parallel with the input capacitor Cin and the two primary side switches 206. The transformer T includes a first primary side winding N11, a second primary side winding N21, a first secondary side winding N12 and a second secondary side winding N22. The first primary side winding N11, a second primary side winding N21 are connected in series between a middle point of the two primary side switches 206 and a middle point of the two bridge capacitors C1, C2. The first secondary side winding N12 and the second secondary side winding N22 are connected in series. The at least one secondary side switch 45 includes two secondary side switches 45. One of the secondary side switches 45 is electrically connected between the first secondary side winding N12 and a first terminal of the output capacitor Co. The other of the secondary side switches 45 is electrically connected between the second secondary side winding N22 and the first terminal of the output capacitor Co.

The power module 9 includes an upper surface, a lower surface, a top layer circuit board 2, a bottom layer circuit board 3 and a middle layer 4. The upper surface and the lower surface are disposed at two outer sides of the power module 9. Preferably but not exclusively, in the embodiment, the upper surface is allowed receiving multiple input signals, the lower surface is allowed outputting multiple output signals. The top layer circuit board 2 includes a first surface 20, a second surface 21 and multiple electronic devices 205. The first surface 20 and a second surface 21 are disposed oppositely. The first surface 20 forms the upper surface of the power module 9, and multiple first signal connection parts 210 are disposed on the first surface 20. The first connection parts 210 is formed by for example but not limited to welding pads for receiving input signals. The multiple electronic devices 205 are disposed on the second surface 21.

The bottom layer circuit board 3 includes a third surface 30 and a fourth surface 31, which are disposed oppositely. The fourth surface 31 forms the lower surface of the power module 9. In the embodiment, multiple second signal connection parts 310 are disposed on the fourth surface 31. Preferably but not exclusively, the second signal connection parts 310 are formed by a Land Grid Array (LGA) package for outputting an output signal.

Preferably but not exclusively, the middle layer 4 is formed by a circuit board. The middle layer 4 is disposed between the top layer circuit board 2 and the bottom layer circuit board 3. In addition, the power module 9 is allowed dissipating the heat through the upper surface and the lower surface.

In some embodiments, as shown in FIG. 3A, the first surface 20 of the top layer circuit board 2 includes a first side edge 200 and a second side edge 201, which are disposed oppositely. Moreover, the top layer circuit board 2 also includes a third side edge 202 and a fourth side edge 203, which are disposed oppositely and located between the first side edge 200 and the second side edge 201. The multiple first signal connection parts 210 are arranged symmetrically adjacent to the first side edge 200 and the second side edge 201 based on a first center axis as an axis (parallel to the first side edge 200) between the first side edge 200 and the second side edge 201. Certainly, in another embodiment, the multiple first signal connection parts 210 are arranged symmetrically adjacent to the third side edge 202 and the fourth side edge 203 based on a second center axis as an axis (parallel to the third side edge 202) between the third side edge 202 and the fourth side edge 203. Preferably but not exclusively, the first signal connection parts 210 are disposed on the first surface 20 through the welding method, and the first signal connection parts 210 are electrically connected to the system board inside the electronic device through a vertical way. Accordingly, the horizontal space of the system board of the system board is not occupied by the first signal connection parts 210. Furthermore, since the upper surface (i.e., the first surface 20) of the power module 9 is relatively flat, and the multiple first signal connection parts 210 are disposed symmetrically adjacent to the first side edge 200 and the second side edge 201, and/or the third side edge 202 and the fourth side edge 203. Therefore, the tension on the solder during welding is uniform and it is not prone to lateral displacement. Consequently, the reliability of the welding point is high. Preferably but not exclusively, in other embodiments, the multiple first signal connection parts 210 are disposed on the first surface 20 through a lamination method or other methods. In another embodiment, the first surface 20 further includes a ground region 204, which is located among the first side edge 200, the second side edge 201, the third side edge 202 and the fourth side edge 203. The location of the ground region 204 and the location of the first signal connection parts 210 are misaligned. In the embodiment, an area of the ground region 204 accounts for more than 50% of an area of the first surface 20. Certainly, other devices are further placed on the first surface 20.

Preferably but not exclusively, multiple electronic devices 205 are disposed on the second surface 21 of the top layer circuit board 2. The multiple electronic devices 205 includes at least one primary side switch 206 and a primary side control chip 207. Preferably but not exclusively, the primary side control chip 207 is used for controlling the operation of the primary side switch 206. In addition, the heat of the primary side switch 206 is transferred outside the power module 9 through the top layer circuit 2. In another embodiment, the multiple electronic devices 205 further includes a secondary side control chip 208.

In some embodiments, the middle layer 4 includes a fifth surface 40 and a sixth surface 41, which are disposed oppositely. The fifth surface 40 is disposed adjacent to the second surface 21 of the top layer circuit board 2, and the sixth surface 41 is disposed adjacent to the third surface 30 of the bottom layer circuit board 3. The fifth surface 40 and/or the sixth surface 41 includes at least one secondary side switch 42. In the embodiment, the secondary side control chip 208 and the secondary side switch 42 are disposed at the top layer circuit board 2 and the middle layer 4, respectively, their locations are corresponding and closed. Accordingly, the secondary side control chip 208 and the secondary side switch 42 are allowed forming a vertical connection through the middle layer 4 and the top layer circuit board 2, so that the driving path between the secondary side control chip 208 and the secondary side switch 42 is decreased. Regarding the middle layer 4, since there is no control chip for driving the secondary switch 42 on the middle layer 4, the utilization degree of the middle layer 4 for transmitting the main power energy is greatly increased. Furthermore, regarding the power module 9, since the trace in the horizontal direction for the driving signal received by the switch is saved, the power density of the power module 9 is increased.

In some embodiments, the first signal connection parts 210 are disposed on the first surface 21 of the top layer circuit board 2 through welding or laminating. The second signal connection parts 310 are disposed on the fourth surface 31 of the bottom layer circuit board 3 through welding or laminating.

In another embodiment, the at least one secondary side switch 42 on the fifth surface 40 and/or the sixth surface 41 of the middle layer 4 includes a first secondary side switch 420, a second secondary side switch 421, a third secondary side switch 422, a fourth secondary side switch 423, a fifth secondary side switch 424 and a sixth secondary side switch 425 for rectification. The first secondary side switch 420, the second secondary side switch 421 and the third secondary side switch 422 are disposed on the fifth surface 40. The fourth secondary side switch 423, the fifth secondary side switch 424 and the sixth secondary side switch 425 are disposed on the sixth surface 41. The first secondary side switch 420, the third secondary side switch 422, the fourth secondary side switch 423 and the sixth secondary side switch 425 are connected in parallel and sharing a first pulse width modulation signal. The second secondary side switch 421 and the fifth secondary side switch 424 are connected in parallel and sharing a second pulse width modulation signal. In another embodiment, the power module 9 includes three magnetic integration circuits A, B, C, as shown in FIG. 3C and FIG. 3D, the middle layer 4 includes three groups of the first secondary side switch 420, the second secondary side switch 421, the third secondary side switch 422, the fourth secondary side switch 423, the fifth secondary side switch 424 and the sixth secondary side switch 425.

In addition, the middle layer 4 further includes at least one magnetic component 43, and each magnetic component 43 is clamped on the middle layer 4 through the fifth surface 40 and the sixth surface 41. Each magnetic component 43 includes a first magnetic core 44 and a second magnetic core 45. The first magnetic core 44 includes a magnetic cover 440, two side columns 441 and two center columns 442. The second magnetic core 45 includes a magnetic cover 450, two side columns 441, and two center columns 442. The two side columns 441 of the first magnetic core 44 and the two side columns 451 of the second magnetic core 45 form a first side column 443 and a second side column 453. The first side column 443 and the second side column 453 are completely symmetric in shape and structure. The two center columns 442 of the first magnetic core 44 and the two center columns 452 of the second magnetic core 45 form a first center column 444 and a second center column 454. The first center column 444 and the second center column 454 are completely symmetric in shape and structure. In addition, the magnetic cover 440 of the first magnetic core 44 and the magnetic cover 450 of the second magnetic core 45 have air gaps.

Figure 3G:
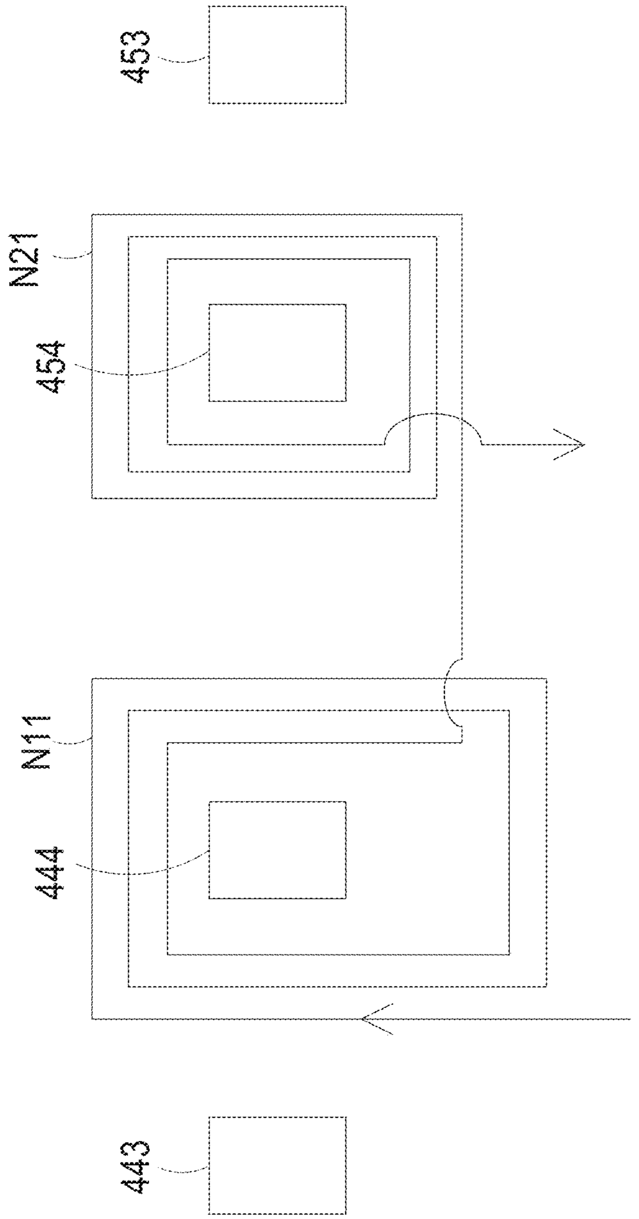
FIG. 3G is a schematic diagram illustrating the transformer of the power module having the first primary side winding and the second primary side winding wound on the magnetic component.

Please refer to FIG. 3G and FIG. 3E. FIG. 3G is a schematic diagram illustrating the transformer of the power module having the first primary side winding and the second primary side winding wound on the magnetic component. In some embodiments, the power module 9 further includes at least one transformer T. Since the power module 9 includes three magnetic integration circuits A, B, C, the power module 9 includes three transformers T. Each transformer T includes a first primary side winding N11, a second primary side winding N21, a first secondary side winding N12, a second secondary side winding N22 and a magnetic component 43. The first primary side winding N11 and the second primary side winding N21 are connected in series, and are wound on the first center column 444 and the second center column 454 of the magnetic component 43, respectively. The first secondary side winding N12 and the second secondary side winding N22 are connected in parallel. The first secondary side winding N12 is wound on the first side column 443 and the second side column 453 of the magnetic component 43 with one turn and in parallel. The second secondary side winding N22 passes through a region between the first center column 444 and the second center column 454. The first secondary side winding N12 and the second secondary side winding N22 are positive coupled. The DC flux are superposed at the first side column 443 and the second side column 453, and are canceled at the first center column 444 and the second center column 454.

In some embodiments, a microcontroller 32, at least one current sampling chip 33 and a power chip 34 are disposed on the third surface 30 of the bottom layer circuit board 3. The current sampling chip 33 is used for sampling an output current signal, for example, the output current signal of the first secondary side winding N12 or the second secondary side winding N22 of the transformer T. After the output current signal is converted into a voltage signal, the voltage signal is transmitted to the microcontroller 32. The power chip 34 converts the input voltage to the required voltages of the microcontroller 32, the primary side control chip 207 and the secondary side control chip 208. Moreover, in another embodiment, an output capacitor Co is further disposed on the third surface 30.

Figure 3H:
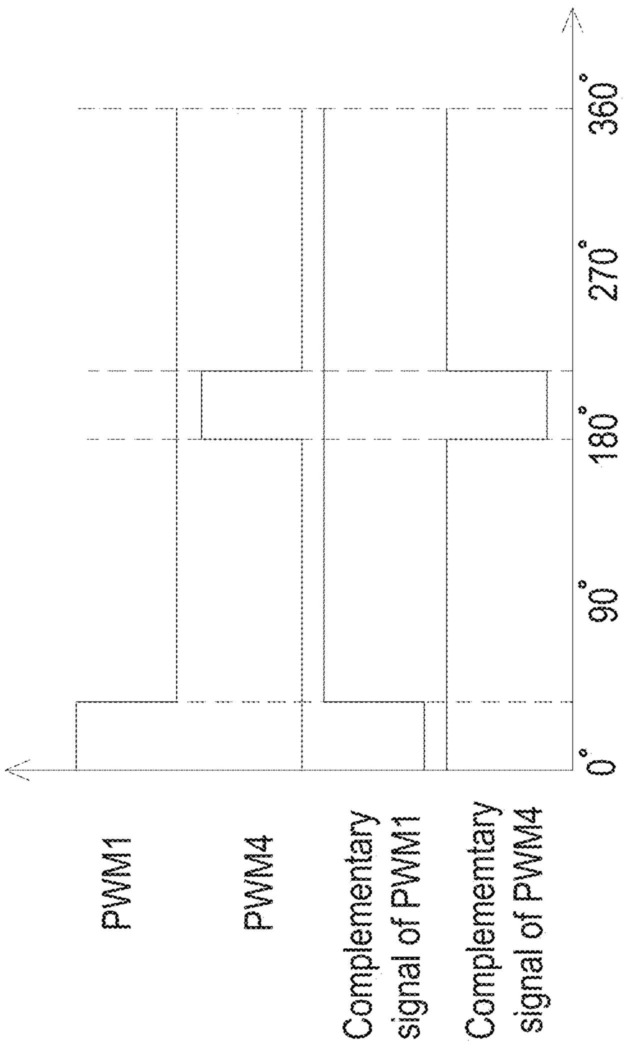
FIG. 3H is a waveform diagram illustrating the pulse width modulation signal received by the two primary side switches and the two secondary side switches of anyone of the magnetic integration circuits shown in FIG. 3E.
Figure 3I:
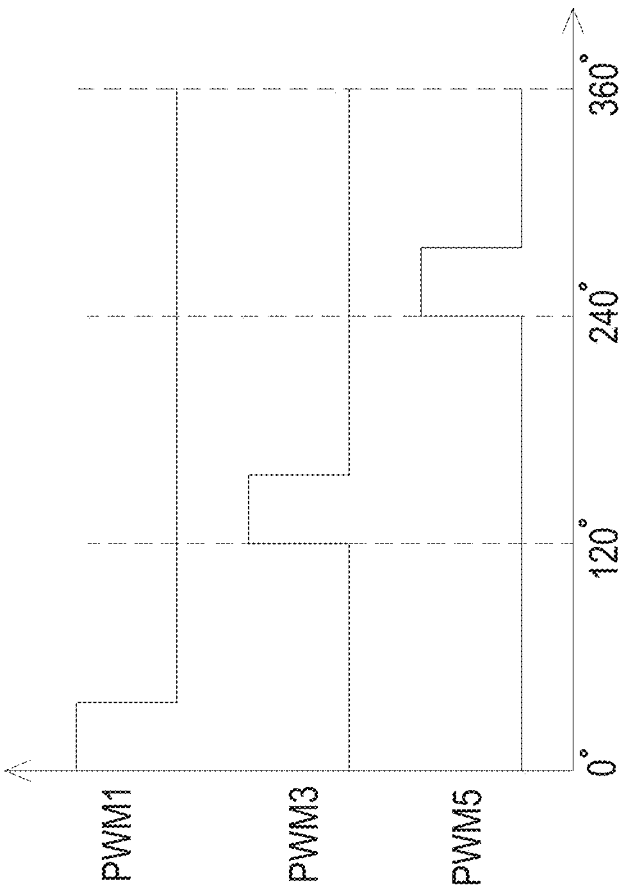
FIG. 3I is a waveform diagram of the pulse width modulation signal received by the primary side switch of the upper bridge arm of the three magnetic integration circuit shown in FIG. 3E.

FIG. 3H is a waveform diagram illustrating the pulse width modulation signal received by the two primary side switches and the two secondary side switches of anyone of the magnetic integration circuits shown in FIG. 3E. FIG. 3I is a waveform diagram of the pulse width modulation signal received by the primary side switch of the upper bridge arm of the three magnetic integration circuit shown in FIG. 3E. Please refer to FIG. 3H, FIG. 3I, and FIG. 3F. In some embodiments, the microcontroller 32 generates six independent pulse width modulation signals through sampling the output voltage of the power module 9. The six independent plus width modulation signals are the pulse width modulation signal PWM1, the pulse width modulation signal PWM2, the pulse width modulation signal PWM3, the pulse width modulation signal PWM4, the pulse width modulation signal PWM5 and the pulse width modulation signal PWM6. The pulse width modulation signal PWM1 to the pulse width modulation signal PWM6 are sequentially staggered by 60° in phase. In addition, the pulse width modulation signal PWM1 and the pulse width modulation signal PWM4 are the driving signals of the two primary side switches 206 of the magnetic integration circuit A, respectively. The phase difference between the pulse width modulation signal PWM1 and the pulse width modulation signal PWM4 are 180 degrees. The two secondary side switches 45 of the magnetic integration circuit A receives a complementary signal of the pulse width modulation signal PWM1 and a complementary signal of the pulse width modulation signal PWM4, respectively. Regarding the magnetic integration circuits B, C, the pulse width modulation signals of the primary side switches 206 and the secondary side switches 46 are similar, and not redundantly described herein. Regarding the primary switches located at identical positions of different magnetic integration circuits, such as the primary side switches 206 of upper bridge arms of the magnetic integration circuit A, the magnetic integration circuit B and magnetic integration circuit C, the driving signals received thereby are the pulse width modulation signal PWM1, the pulse width modulation signal PWM3 and the pulse width modulation signal PWM5, respectively. Phases of the pulse width modulation signal PWM1, the pulse width modulation signal PWM3, and the pulse width modulation signal PWM5 are sequentially staggered by (360°/N)=120° (i.e., N=3). Taking the pulse width modulation signals received by the primary side switches 206 of the upper bridge arms of the magnetic integration circuits A, B, C as an example, the waveforms are shown as FIG. 3I.

In the embodiment, the microcontroller 32 generates six pulse width modulation signals which are sequentially staggered by 60 degrees in phase, to control the three magnetic integration circuits A, B, C, respectively. Comparing to generating a pair of pulse width modulation signals staggered by 180 degrees in phase for controlling a single magnetic integration circuit, the number of phases of the pulse width modulation signals in the present disclosure is doubled, so that AC current components with six-times frequency on the input capacitor Cin and the output capacitor Co are greatly increased. Consequently, the AC current component of the entire power module 9 is greatly decreased. Accordingly, the numbers of the input capacitor Cin and the output capacitor Co of the power module 9 are greatly reduced in the power module of the present disclosure to maintain the predetermined input voltage and output voltage.

Certainly, the power module 9 does not limit to three magnetic integration circuits. In some embodiment, the power module 9 includes N magnetic integration circuits, and N is a positive integer greater than 1. Moreover, each magnetic integration circuit includes at least one primary side switch 206, primary side control chip 207, a secondary side control chip 208, at least one secondary side switch 42 and a transformer T.

In an embodiment, the power module 9 includes N magnetic integration circuits, and a phase difference among the diving signals of the primary side switches located at identical positions of the N magnetic integration circuits is 360°/N.

In some embodiments, as shown in FIG. 3C, the power module 9 further includes multiple first conduction parts 5 and multiple second conduction parts 6. The multiple first conduction parts 5 and the multiple second conduction parts 6 are disposed between the middle layer 4 and the bottom layer circuit board 3, respectively, by welding method. In the embodiment, the first conduction parts 5 are used for transmitting the output voltage generated by the at least one secondary switch 42 of the middle layer 4 to the bottom layer circuit board 3. The second conduction parts 6 are grounded. In the embodiment, the shape of the multiple conduction parts 5 is the same, and the multiple conduction parts 5 are arranged equidistantly between the middle layer 4 and the bottom layer circuit board 3 along a direction parallel to the third side edge 202. The power of the power module 9 is allowed flowing from the middle layer 4 to the bottom layer circuit board 3 by utilizing the multiple conduction parts 5 and the multiple conduction parts 6. Furthermore, the middle layer 4 is a main region that the secondary switch 42 and the magnetic component 43 generate loss, and the heat generated from the middle layer 4 is allowed transferring to the bottom layer circuit board 3 through the multiple first conduction parts 5 and the multiple second conduction parts 6, so as to be dissipated to the outside of the power module 9. Furthermore, the multiple first conduction parts 5 and the multiple second conduction parts 6 are used for fixing the middle layer 4 and the bottom layer circuit board 3.

Figure 4:
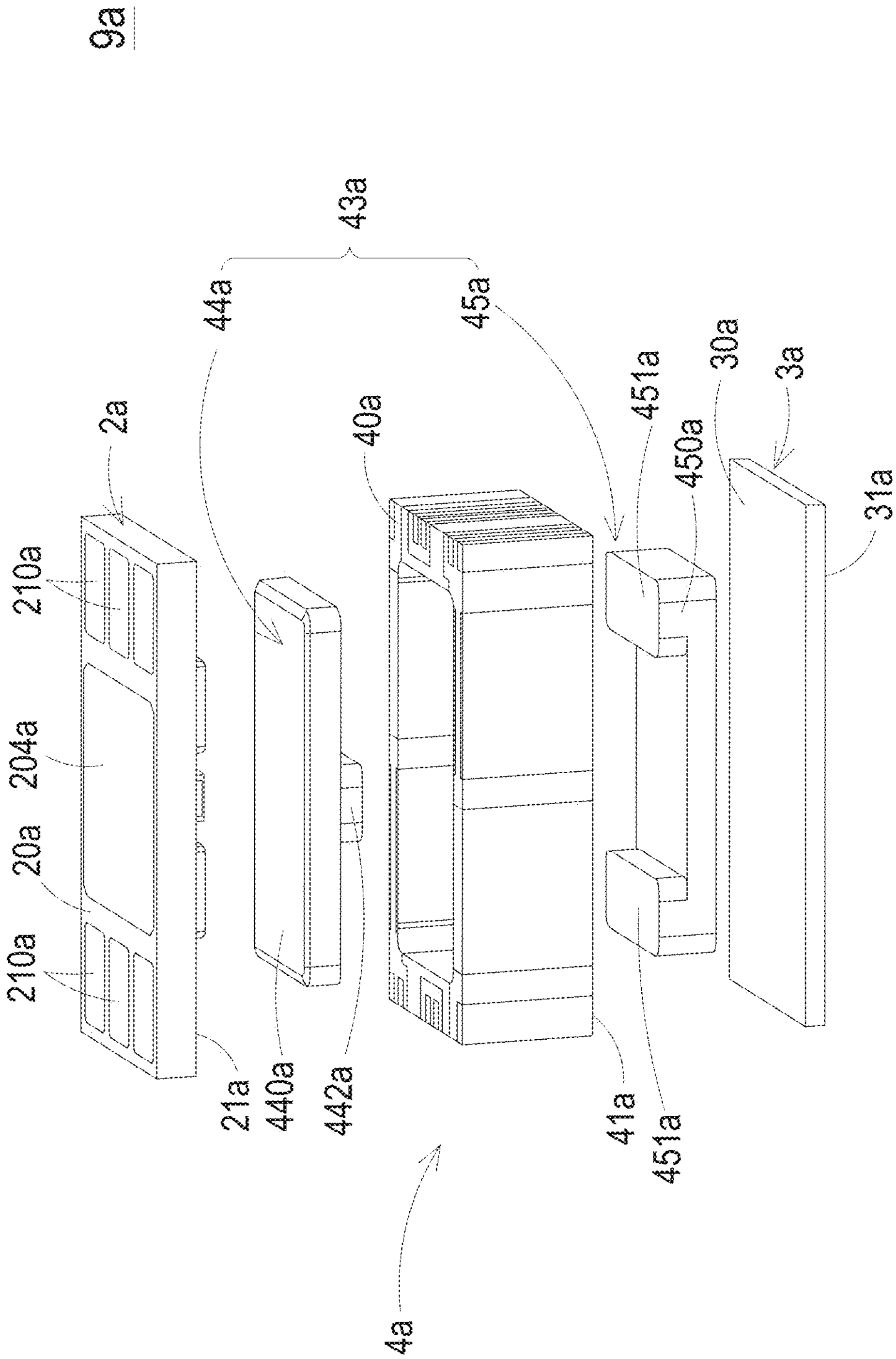
FIG. 4 is a schematic structural diagram illustrating a power module according to a second preferred embodiment of the present disclosure.

Please refer to FIG. 4, which is a schematic structural diagram illustrating a power module according to a second preferred embodiment of the present disclosure. In the embodiment, the power module 9*a* is applied in an electronic device (not shown), and connected with a system board of the electronic device to realize an electronic connection by welding method. The power module 9*a* includes an upper surface, a lower surface, a top layer circuit board 2*a*, a bottom layer circuit board 3*a* and a middle layer 4*a*. The upper surface and the lower surface are disposed at two outer sides of the power module 9*a*. In the embodiment, the upper surface is used for receiving multiple input signals, and the lower surface is used for outputting multiple output signals. The top layer circuit board 2*a* includes a first surface 20*a*, a second surface 21*a* and multiple electronic devices, and the first surface 20*a* and the second surface 21*a* are disposed oppositely. The first surface 20*a* forms the upper surface of the power module 9*a*, and multiple first signal connection parts 210*a* are disposed on the first surface 20*a*. The first signal connection parts 210*a* is formed by for example but not limited to welding pads for receiving input signals. The multiple electronic devices are embedded in the top layer circuit board 2*a*. Accordingly, a larger heat dissipation area is provided by the top layer circuit board 2*a*, and it is beneficial for transferring the heat generated from the multiple electronic devices to the top layer circuit board 2*a* to increase the heat dissipation efficiency of the multiple electronic devices.

The bottom layer circuit board 3*a* includes a third surface 30*a* and a fourth surface 31*a*, which are disposed oppositely. The fourth surface 31*a* forms the lower surface of the power module 9*a*. Preferably but not exclusively, multiple second signal connection parts (not shown) are disposed on the fourth surface 31*a*. The second signal connection parts are formed by a Land Grid Array (LGA) package for outputting an output signal.

The middle layer 4*a* is formed by for example but not limited to a circuit board, and is disposed between the top layer circuit board 2*a* and the bottom layer circuit board 3*a*. In the embodiment, the middle layer 4*a* includes a fifth surface 40*a* and a sixth surface 41*a*, which are disposed oppositely. The fifth surface 40*a* is disposed adjacent to the second surface 21*a*, and the sixth surface 41*a* is disposed adjacent to the third surface 30*a*. In the embodiment, the middle layer 4*a* further includes at least one magnetic component 43*a*, and each magnetic component 43*a* is clamped on the middle layer 4*a* through the fifth surface 40*a* and the sixth surface 41*a*. Each magnetic component 43*a* includes a first magnetic core 44*a* and a second magnetic core 45*a*. The first magnetic core 44*a* includes a first magnetic cover 440*a* and a center column 442*a*. The second magnetic core 45*a* includes a second magnetic cover 450*a* and two side columns 451*a*.

In some embodiments, the fifth surface 40*a* of the middle layer 4*a* is connect with the second surface 21*a* of the top layer circuit board 2*a* by the welding method. The sixth surface 41*a* of the middle layer is connect with the third surface 30*a* of the bottom layer circuit board 3*a* by the welding method.

In another embodiment, the first surface 20*a* further includes a ground region 204*a*, and the location of ground region 204*a* and the location of the first signal connection parts 210*a* are misaligned. An area of the ground region 204*a* accounts for more than 50% of an area of the first surface 20*a*.

Figure 5:
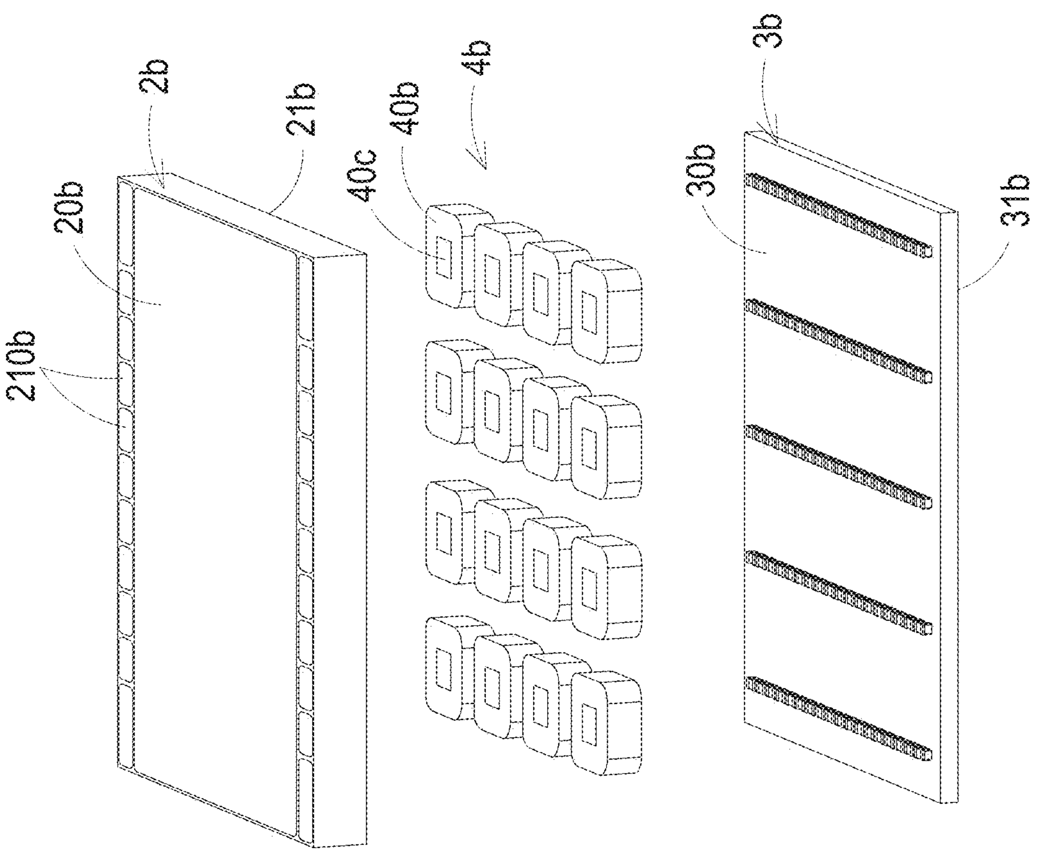
FIG. 5 is a schematic structural diagram illustrating a power module according to a third preferred embodiment of the present disclosure.

Please refer to FIG. 5, which is a schematic structural diagram illustrating a power module according to a third preferred embodiment of the present disclosure. In the embodiment, the power module 9*b* is applied in an electronic device (not shown), and connected with a system board of the electronic device to realize an electronic connection by welding method. The power module 9*b* includes an upper surface, a lower surface, a top layer circuit board 2*b*, a bottom layer circuit board 3*b* and a middle layer 4*b*. The upper surface and the lower surface are disposed at two outer sides of the power module 9*b*. In the embodiment, the upper surface is used for receiving multiple input signals, and the lower surface is used for outputting multiple output signals. The top layer circuit board 2*b* includes a first surface 20*b*, a second surface 21*b* and multiple electronic devices, and the first surface 20*b* and the second surface 21*b* are disposed oppositely. The first surface 20*b* forms the upper surface of the power module 9*b*, and multiple first signal connection parts 210*b* are disposed on the first surface 20*b*. The first signal connection parts 210*b* is formed by for example but not limited to welding pad for receiving input signals. The multiple electronic devices are embedded in the top layer circuit board 2*b*. Accordingly, since the multiple electronic devices are embedded in the top layer circuit board 2*b*, a larger heat dissipation area is provided by the top layer circuit board 2*b*, and it is beneficial for transferring the heat generated from the multiple electronic devices to the top layer circuit board 2*b* to increase the heat dissipation efficiency of the multiple electronic devices.

The bottom layer circuit board 3*b* includes a third surface 30*b* and a fourth surface 31*b*, which are disposed oppositely. The fourth surface 31*b* forms the lower surface of the power module 9*b*. Preferably but not exclusively, multiple second signal connection parts (not shown) are disposed on the fourth surface 31*b*. The second signal connection parts are formed by a Land Grid Array (LGA) package for outputting an output signal. Furthermore, at least one copper column connection part (not shown) is disposed on the second surface 21*b* of the top layer circuit board 2*b* for connecting the third surface 30*b* of the bottom layer circuit board 3*b* to fix the top layer circuit board 2*b* and the bottom layer circuit board 3*b*.

The middle layer 4*b* is formed by for example but not limited to at least one magnetic core 40*b*, and each magnetic core 40*b* includes a through hole 40*c*. Each copper column connection part passes through the through hole of a corresponding one of the at least one magnetic core 40*b*, so as to form a winding.

Figure 6:
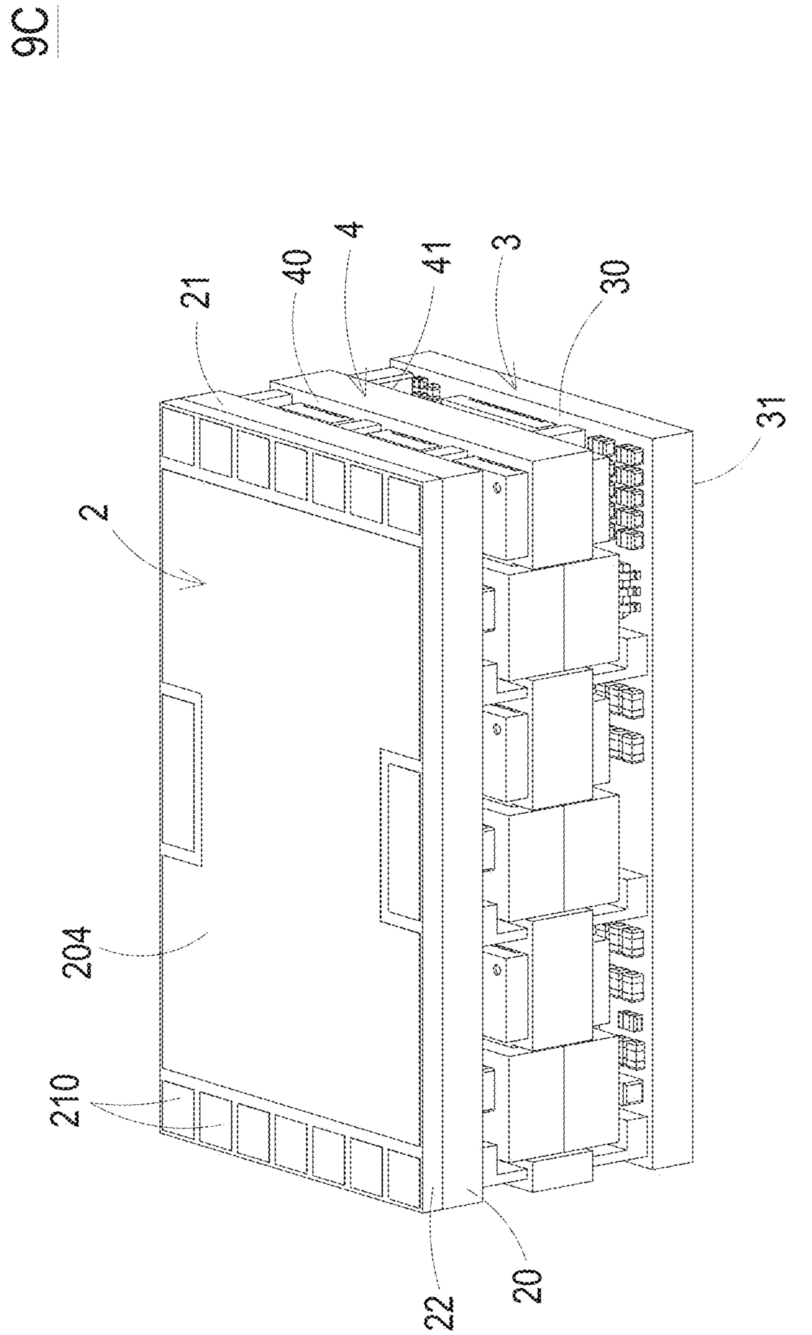
FIG. 6 is a schematic structural diagram illustrating a power module according to a fourth preferred embodiment of the present disclosure.

Please refer to FIG. 6, which is a schematic structural diagram illustrating a power module according to a fourth preferred embodiment of the present disclosure. In the embodiment, the structures, elements and functions of the power module 9*c* are similar to those of the power module 9 of FIG. 3A, and are not redundantly described herein.

Different from the power module 9 of in FIG. 3A, in the embodiment, the power module 9*c* includes a plastic sealing layer 22 disposed on the first surface 20 of the top layer circuit board 2. The plastic sealing layer 22 is used for sealing the first surface 20 and the multiple electronic devices, and the multiple first signal connection parts 210 are exposed on the plastic sealing layer 22. In the embodiment, since the surfaces of the multiple electronic devices 205 of the top layer circuit board 2 of the power module 9*c* are completely contacted with the plastic sealing layer 22, the heat dissipation efficiency is increased. In addition, the plastic sealing layer 22 has advantages of smoothness and good flatness.

Figure 7A:
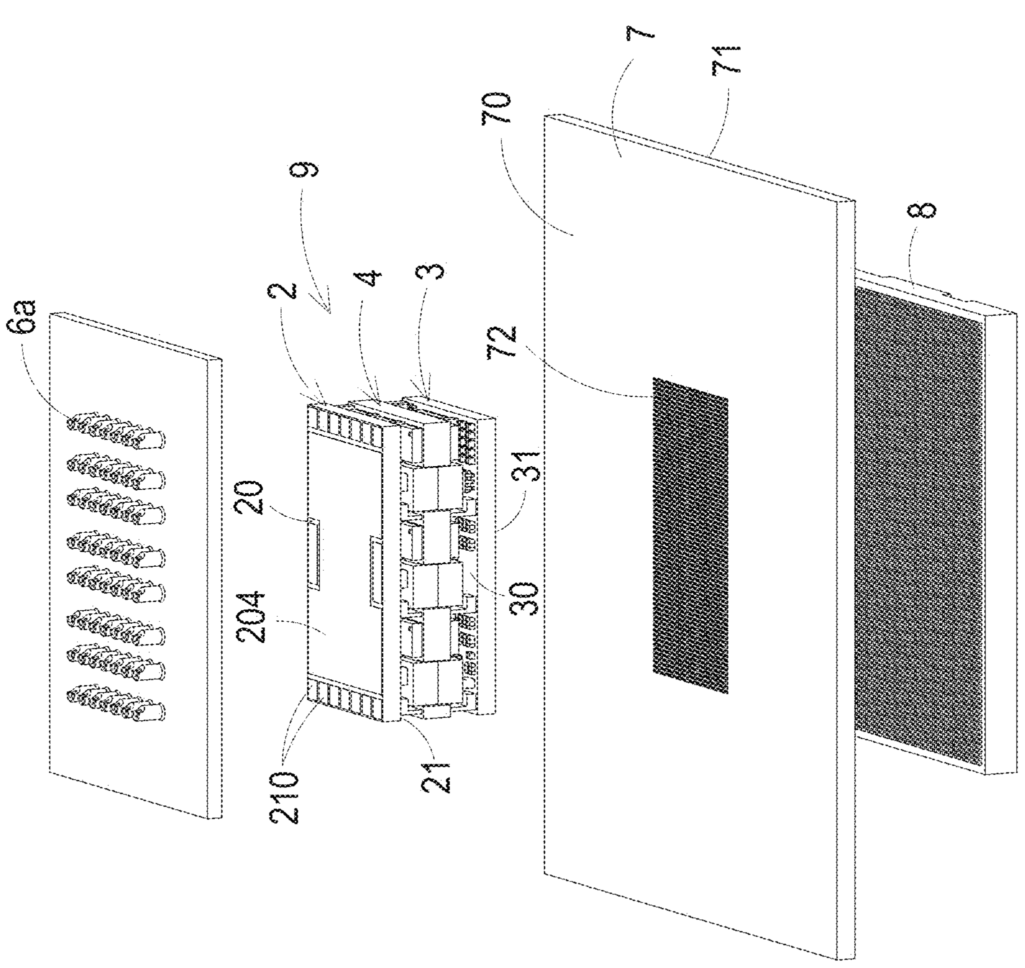
FIG. 7A is an exploded view illustrating a power device according to an embodiment of the present disclosure.
Figure 7B:
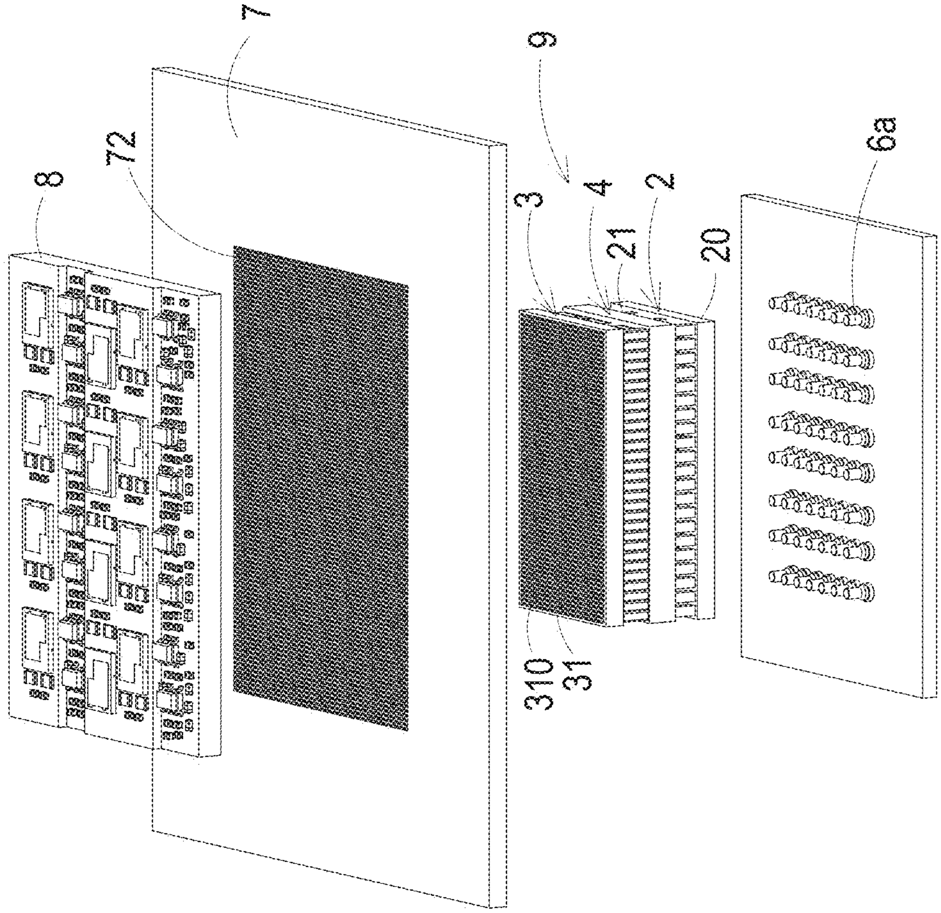
FIG. 7B is an exploded view illustrating the power device according to the embodiment of the present disclosure from another perspective.

Please refer to FIG. 7A and FIG. 7B. FIG. 7A is an exploded view illustrating a power device according to an embodiment of the present disclosure. FIG. 7B is an exploded view illustrating the power device according to the embodiment of the present disclosure from another perspective. In the embodiment, the power device 5*a* includes at least one external connection terminal 6*a* and a power module. The external connection terminal 6*a* provides at least one input signal. The power module is the power module illustrated in anyone of the first embodiment to the fourth embodiment. FIG. 7A takes the power module 9 of the first embodiment for illustrating. The first signal connection parts 210 on the first surface 20 of the top layer circuit board 2 are electrically connect to the external connection terminal 6*a* through a laminating method, and configured to receive the input signal through the external connection terminal 6*a*.

In addition, the power device 5*a* further includes a system board 7 and a load 8. The system board 7 is disposed between the fourth surface 31 of the bottom layer circuit board 3 and the load 8. The system board 7 includes a seventh surface 70 and an eighth surface 71. In the embodiment, a third signal connection part 72 is disposed on the seventh surface 70 and the eighth surface 71, respectively, and the third signal connection parts 71 are formed by a Land Grid Array (LGA) package for electrically connecting to the second signal connection part 310 on the fourth surface 31. The connection way between the second signal connection part 310 and the third signal connection part 72 is simple, and capable of reducing the parasitic impedance on the system board 7 and decreasing the conduction loss. It facilitates the power module of the power device 5*a* to keep a high-power providing efficiency to the load 8.

In some embodiment, the external connection terminal 6*a* is allowed transmitting main power signals and controlling relative signals. For the first signal connection part 210 requiring higher heat dissipation and power level, the transmittance of the input signals is shared by multiple external connection terminals 6*a* commonly.

In summary, the present disclosure provides a power module and a power device. The power module receives the input signal through the first surface of the top layer circuit board, converts the input signal into the output signal through the magnetic integration circuit, and connects the load through the fourth surface of the bottom layer circuit board. That is, the transmittance path of the entire power signals in the present disclosure is reduced greatly through the vertical structure of the three-layer boards. Accordingly, the efficiency and the power density are increased, and the line loss is reduced. In addition, since the vertical transmittance of the signals does not occupy the space in the horizontal direction, it helps to greatly release the space on the system board, simplify the internal trace, and facilitate the miniaturization and integration of the power module.

What is claimed is:

1. A power module, comprising:

an upper surface for receiving multiple input signals;

a lower surface for outputting multiple output signals, wherein the upper surface and the lower surface are disposed at two outer sides of the power module;

a top layer circuit board comprising a first surface, a second surface and multiple electronic devices, wherein the first surface and the second surface are disposed oppositely, the first surface forms the upper surface, and multiple first signal connection parts are disposed on the first surface for receiving the multiple input signals;

a bottom layer circuit board comprising a third surface and a fourth surface, wherein the third surface and a fourth surface are disposed oppositely, the fourth surface forms the lower surface, and multiple second signal connection parts are disposed on the fourth surface for outputting the multiple output signals; and a middle layer disposed between the top layer circuit board and the bottom layer circuit board;

wherein the first surface comprises a first side edge, a second side edge, a third side edge and a fourth side edge, wherein the first side edge and the second side edge are disposed oppositely, the third side edge and the fourth side edge are located between the first side edge and the second side edge, and disposed oppositely, the multiple first signal connection parts are symmetrically disposed at the first side edge and the second side edge, or the multiple first signal connection parts are symmetrically disposed at the third side edge and the fourth side edge;

wherein the first surface comprises a ground region located among the first side edge, the second side edge, the third side edge and the fourth side edge, and an area of the first ground region accounts for more than 50% of an area of the first surface.

2. The power module according to claim 1, wherein the multiple electronic devices are disposed on the second surface, the multiple electronic devices comprise at least one primary side switch and a primary side control chip, and the primary side control chip is used for controlling the primary side switch.

3. The power module according to claim 2, wherein the middle layer is formed by a circuit board, and comprises a fifth surface and a sixth surface disposed oppositely, the fifth surface is disposed adjacent to the second surface, the sixth surface is disposed adjacent to the third surface, and at least one secondary side switch is disposed on the fifth surface and/or the sixth surface.

4. The power module according to claim 3, wherein the at least one secondary side switch comprises a first secondary side switch, a second secondary side switch, a third secondary side switch, a fourth secondary side switch, a fifth secondary side switch and a sixth secondary side switch, which are used for rectification; the first secondary side switch, the second secondary side switch and the third secondary side switch are disposed on the fifth surface; the fourth secondary side switch, the fifth secondary side switch and the sixth secondary side switch are disposed on the sixth surface; the first secondary side switch, the third secondary side switch, the fourth secondary side switch and the sixth secondary side switch are connected in parallel and sharing a first pulse width modulation signal, and the second secondary side switch and the fifth secondary side switch are connected in parallel and sharing a second pulse width modulation signal.

5. The power module according to claim 4, wherein the power module further comprises multiple first conduction parts and multiple second conduction parts, and the multiple first conduction parts and the multiple second conduction parts are disposed between the middle layer and the bottom layer circuit board, respectively, wherein the multiple first conduction parts are used for delivering an output voltage generated by the at least one secondary switch of the middle layer to the bottom layer circuit board, and the second conduction parts are grounded.

6. The power module according to claim 3, wherein the middle layer further comprises at least one magnetic component, and each of the at least one magnetic component is clamped on the middle layer through the fifth surface and the sixth surface, and comprises a first magnetic core and a second magnetic core, wherein each of the first magnetic core and the second magnetic core comprises a magnetic cover, two side columns and two center columns, respectively; the two side columns of the first magnetic core and the two side columns of the second magnetic core form a first side column and a second side column; the two center columns of the first magnetic core and the two center columns of the second magnetic core form a first center column and a second center column; and each of the magnetic covers has an air gap.

7. The power module according to claim 6, wherein the power module further comprises at least one transformer; each of the at least one transformer comprises a first primary side winding, a second primary side winding, a first secondary side winding, a second secondary side winding and the magnetic component; the first primary side winding and the second primary side winding are connected in series and wound on the first center column and the second center column, respectively; and the first secondary side winding and the second secondary side winding are connected in parallel, wherein the first secondary side winding are wound on the first side column and the second side column, and the second secondary side winding are wound on the magnetic cover of the first magnetic core or the magnetic cover of the second magnetic core.

8. The power module according to claim 7, wherein a microcontroller, at least one current sampling chip and a power chip are disposed on the third surface; the current sampling chip is used for sampling an output current signal, converting the output current signal into a voltage signal, and transmitting the voltage signal to the microcontroller; and the power chip converts an input voltage into required voltages of the microcontroller, the primary side control chip and the secondary side control chip.

9. The power module according to claim 8, wherein the power module comprises N magnetic integration circuits, wherein N is a positive integer greater than 1; and each of the magnetic integration circuits includes the at least one primary side switch, the primary side control chip, the secondary side control chip, the at least one secondary side switch and the at least one transformer.

10. The power module according to claim 9, wherein each of the magnetic integration circuits comprises an input terminal and an output terminal, the input terminals of the multiple magnetic integration circuits are connected in parallel, and the output terminals of the multiple magnetic integration circuits are connected in parallel.

11. The power module according to claim 9, wherein a phase difference among driving signals of the primary side switches located at identical positions of the N magnetic integration circuits is 360°/N.

12. The power module according to claim 9, wherein a phase difference between driving signals of the two primary side switches in an identical one of the magnetic integration circuits is 180°.

13. The power module according to claim 3, wherein a plastic sealing layer and the multiple electronic devices are disposed on the first surface, the plastic sealing layer is used for sealing the first surface, and the multiple first signal connection parts are exposed on the plastic sealing layer.

14. The power module according to claim 1, wherein the multiple electronic devices are embedded in the top layer circuit board.

15. The power module according to claim 14, wherein the middle layer is formed by a circuit board, and comprises a fifth surface and a sixth surface, the fifth surface and the sixth surface are disposed oppositely, the fifth surface is disposed adjacent to the second surface, the sixth surface is disposed adjacent to the third surface; the middle layer further comprises at least one magnetic component, and each of the at least one magnetic component is clamped on the middle layer through the fifth surface and the sixth surface and comprises a first magnetic core and a second magnetic core, wherein the first magnetic core comprises a first magnetic cover and a center column, and the second magnetic core comprises a second magnetic cover and two side columns.

16. The power module according to claim 1, wherein at least one copper column connection part is disposed on the second surface of the top layer circuit further comprises for connecting the third surface of the bottom layer circuit board to fix the top layer circuit board and the bottom layer circuit board.

17. The power module according to claim 16, wherein the middle layer is formed by at least one magnetic core, each of the at least one magnetic core comprises a through hole, each of the at least one copper column connection part passes through the through hole of a corresponding one of the at least one magnetic core, so as to form a winding.

18. The power module according to claim 1, wherein at least one output capacitor is disposed on the third surface.

19. The power module according to claim 1, wherein the second signal connection parts are formed by a Land Grid Array (LGA) package.

20. The power module according to claim 1, wherein the power module dissipates heat through the upper surface and the lower surface.

21. A power device, comprising:

at least one external connection terminal for providing at least one input signal;

a power module, comprising:

an upper surface;

a lower surface for outputting at least one output signal, wherein the upper surface and the lower surface are disposed at two outer sides of the power module;

a top layer circuit board comprising a first surface, a second surface and multiple electronic devices, wherein the first surface and the second surface are disposed oppositely, the first surface forms the upper surface, at least one first signal connection part is disposed on the first surface, and the first signal connection part is electrically connected to the external connection terminal for receiving the input signal;

a bottom layer circuit board comprising a third surface and a fourth surface, wherein the third surface and a fourth surface are disposed oppositely, the fourth surface forms the lower surface, and at least one second signal connection part is disposed on the fourth surface for outputting the output signal; and a middle layer disposed between the top layer circuit board and the bottom layer circuit board; and a system board disposed on the fourth surface for receiving the output signal outputted from the second signal connection part;

wherein the first surface comprises a first side edge, a second side edge, a third side edge and a fourth side edge, wherein the first side edge and the second side edge are disposed oppositely, the third side edge and the fourth side edge are located between the first side edge and the second side edge, and disposed oppositely, the at least one first signal connection part is disposed at the first side edge and the second side edge, or the at least one first signal connection part is disposed at the third side edge and the fourth side edge;

wherein the first surface comprises a ground region located among the first side edge, the second side edge, the third side edge and the fourth side edge, and an area of the first ground region accounts for more than 50% of an area of the first surface.

* * * * *